United States Patent
Kazuno et al.

(10) Patent No.: US 11,364,813 B2
(45) Date of Patent: Jun. 21, 2022

(54) BATTERY STATE DETERMINATION SYSTEM, BATTERY STATE DETERMINATION METHOD, AND RECORDING MEDIUM

(71) Applicant: HONDA MOTOR CO., LTD., Tokyo (JP)

(72) Inventors: Shuichi Kazuno, Wako (JP); Tsubasa Uchida, Wako (JP); Takuma Kawahara, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/082,047

(22) Filed: Oct. 28, 2020

(65) Prior Publication Data

US 2021/0138929 A1    May 13, 2021

(30) Foreign Application Priority Data

Nov. 8, 2019   (JP) .............................. JP2019-203240

(51) Int. Cl.
*B60L 58/16*      (2019.01)
*G01R 31/392*    (2019.01)

(52) U.S. Cl.
CPC ............ *B60L 58/16* (2019.02); *G01R 31/392* (2019.01)

(58) Field of Classification Search
CPC ...... B60L 58/16; B60L 3/12; B60L 2240/547; B60L 58/12; B60L 58/10; B60L 3/0046;

(Continued)

(56) References Cited

U.S. PATENT DOCUMENTS

| 6,738,697 B2* | 5/2004 | Breed ..................... B60C 11/24 701/31.5 |
| 7,650,210 B2* | 1/2010 | Breed ..................... G07C 5/008 701/31.9 |

(Continued)

FOREIGN PATENT DOCUMENTS

| JP | 2018-029430 | 2/2018 |
| JP | 2018-129269 | 8/2018 |

(Continued)

OTHER PUBLICATIONS

Japanese Office Action for Japanese Patent Application No. 2019-203240 dated Oct. 12, 2021.

*Primary Examiner* — Tung S Lau
(74) *Attorney, Agent, or Firm* — Amin, Turocy & Watson, LLP (57) ABSTRACT

A battery state determination system includes a first in-vehicle device and a server device, the first in-vehicle device includes a first acquisition part that acquires physical quantity data related to a state of a battery, a first diagnostic part that performs deterioration diagnosis on the battery at a first operation cycle on the basis of the physical quantity data, and a first transmission part that transmits the physical quantity data and the diagnostic results of deterioration diagnosis to the server device, and the server device includes a reception part that receives the physical quantity data or the diagnostic result of the deterioration diagnosis from the first in-vehicle device, and a server-side processing part that performs a processing other than the deterioration diagnosis at an operation cycle which is longer than the first operation cycle on the basis of the diagnostic result of the deterioration diagnosis and/or the physical quantity data.

11 Claims, 6 Drawing Sheets

(58) Field of Classification Search
CPC .............. B60L 2240/54; G01R 31/392; B06L 2240/594; Y02T 10/70; G01M 17/007
See application file for complete search history.

(56) References Cited

U.S. PATENT DOCUMENTS

| | | | | |
|---|---|---|---|---|
| 8,024,084 B2* | 9/2011 | Breed | ................... | G07C 5/008 |
| | | | | 701/31.4 |
| 8,370,020 B2* | 2/2013 | Bauman | ................. | G07C 5/008 |
| | | | | 701/33.2 |
| 9,047,719 B2* | 6/2015 | Yagi | .................... | F02N 11/0814 |
| 9,493,074 B2* | 11/2016 | Reese | .................. | G07C 5/0808 |
| 11,110,816 B2* | 9/2021 | Rini | ........................ | B60L 53/62 |
| 2008/0161989 A1* | 7/2008 | Breed | .............. | B60R 21/01532 |
| | | | | 701/31.4 |
| 2008/0316006 A1* | 12/2008 | Bauman | ................. | G07C 5/008 |
| | | | | 340/425.5 |
| 2009/0043441 A1* | 2/2009 | Breed | .................... | G07C 5/008 |
| | | | | 701/31.9 |
| 2014/0244099 A1* | 8/2014 | Kakinuma | ............. | G07C 5/008 |
| | | | | 701/31.4 |
| 2014/0358359 A1* | 12/2014 | Yagi | ........................ | F02N 11/10 |
| | | | | 701/31.4 |
| 2015/0134192 A1* | 5/2015 | Kakinuma | ............ | B60W 50/04 |
| | | | | 701/31.4 |
| 2016/0039291 A1* | 2/2016 | Reese | .................. | G01R 31/007 |
| | | | | 701/29.3 |
| 2021/0178884 A1* | 6/2021 | Tanaka | ................. | B60W 50/14 |

FOREIGN PATENT DOCUMENTS

| | | |
|---|---|---|
| JP | 2018-148650 | 9/2018 |
| WO | 2016/208251 | 12/2016 |

* cited by examiner

BATTERY STATE DETERMINATION SYSTEM, BATTERY STATE DETERMINATION METHOD, AND RECORDING MEDIUM

CROSS-REFERENCE TO RELATED APPLICATION

Priority is claimed on Japanese Patent Application No. 2019-203240, filed Nov. 8, 2019, the content of which is incorporated herein by reference.

BACKGROUND OF THE INVENTION

Field of the Invention

The present invention relates to a battery state determination system, a battery state determination method, and a recording medium.

Description of Related Art

In the related art, a technology of determining a deterioration state of a battery for a vehicle is disclosed (for example, Japanese Unexamined Patent Application, First Publication No. 2018-129269).

SUMMARY OF THE INVENTION

However, in the related art, when it is attempted to determine the deterioration state of a battery more accurately on the basis of a charging and discharge history over the medium or long term, the detection results of a battery voltage value/current value, or the like, processing of determining a deterioration state of a battery needs to be performed while storing these pieces of information in an external device such as a cloud server or the like. In this case, since time is required for transmission and reception of data, there was a possibility that the deterioration determination having good real time characteristics may not be able to be performed.

An aspect of the present invention is directed to providing a battery state determination system, a battery state determination method, and a recording medium that are capable of improving the real time characteristics in determination of a deterioration state of a battery.

A battery state determination system, a battery state determination method, and a recording medium according to the present invention employ the following configurations.

(1) A battery state determination system according to an aspect of the present invention includes a first in-vehicle device; and a server device, wherein the first in-vehicle device includes: a first acquisition part configured to acquire physical quantity data showing a physical quantity related to a state of a battery mounted on the vehicle; a first diagnostic part configured to perform deterioration diagnosis with respect to the battery at a first operation cycle on the basis of the physical quantity data; and a first transmission part configured to transmit the physical quantity data and the diagnostic results of deterioration diagnosis with respect to the battery obtained by the first diagnostic part to the server device, and the server device includes: a reception part configured to receive at least either one of the physical quantity data or the diagnostic results of the deterioration diagnosis with respect to the battery from the first in-vehicle device; and a server-side processing part configured to perform at least a processing other than the deterioration diagnosis with respect to the battery at an operation cycle which is longer than the first operation cycle on the basis of the diagnostic results of the deterioration diagnosis with respect to the battery and/or the physical quantity data.

(2) In the aspect of the above-mentioned (1), the server-side processing part may collect a usage history of the battery as the processing other than the deterioration diagnosis with respect to the battery.

(3) In the aspect of the above-mentioned (1) or (2), the battery state determination system may further include a second in-vehicle device mounted on the vehicle in which the first in-vehicle device is mounted and different from the first in-vehicle device, wherein the second in-vehicle device may comprise a second acquisition part configured to acquire the physical quantity data; a second diagnostic part configured to perform deterioration diagnosis with respect to the battery as an alternative of the first diagnostic part; and a second transmission part configured to transmit the physical quantity data and the diagnostic results obtained by the second diagnostic part to the server device, the first in-vehicle device may include a determination part configured to determine whether an operation processing load on the first in-vehicle device is equal to or greater than a predetermined load degree, and at least the second diagnostic part and the second transmission part may be operated when it is determined by the determination part that the operation processing load on the first in-vehicle device is equal to or greater than the predetermined load degree.

(4) In the aspect of the above-mentioned (1) or (2), the battery state determination system may further include a second in-vehicle device mounted on the vehicle in which the first in-vehicle device is mounted and different from the first in-vehicle device, wherein the second in-vehicle device may include a second acquisition part configured to acquire the physical quantity data; a second diagnostic part configured to perform the deterioration diagnosis with respect to the battery as an alternative of the first diagnostic part; a second transmission part configured to transmit the physical quantity data and the diagnostic results obtained by the second diagnostic part to the server device; and a determination part configured to determine whether an operation processing load on the first in-vehicle device is equal to or greater than a predetermined load degree, and at least the second diagnostic part and the second transmission part may be operated when it is determined by the determination part that the operation processing load on the first in-vehicle device is equal to or greater than the predetermined load degree.

(5) In the aspect of the above-mentioned (3) or (4), the first transmission part may further transmit information related to the usage history of the device mounted on the vehicle, and at least one of the first diagnostic part and the second diagnostic part may perform diagnosis of a deterioration degree of the battery according to the usage of the device.

(6) In the aspect of any one of the above-mentioned (3) to (5), the determination part may further determine whether an operation processing load of the second in-vehicle device is equal to or greater than the predetermined load degree, and the server device may further include a third diagnostic part configured to perform the deterioration diagnosis by the first diagnostic part with respect to the battery instead of the first diagnostic part when it is determined by the determination part that both operation processing loads of the first in-vehicle device and the second in-vehicle device are equal to or greater than the predetermined load degree.

(7) A battery state determination method according to an aspect of the present invention, which is performed by an in-vehicle device, includes acquiring physical quantity data showing a physical quantity related to a state of a battery mounted on the vehicle; performing deterioration diagnosis with respect to the battery at a first operation cycle on the basis of the physical quantity data; and transmitting the physical quantity data and a diagnostic result of the deterioration diagnosis with respect to the battery to a server device, wherein the server device receives at least either one of the physical quantity data or the diagnostic result of the deterioration diagnosis with respect to the battery from the in-vehicle device, and performs at least a processing other than the deterioration diagnosis with respect to the battery at an operation cycle which is longer than the first operation cycle on the basis of the diagnostic result of the deterioration diagnosis with respect to the battery and/or the physical quantity data.

(8) A recording medium according to an aspect of the present invention, on which a program is stored, is provided, and the program is configured to cause a computer of a first in-vehicle device to: acquire physical quantity data showing a physical quantity related to a state of a battery mounted on the vehicle and perform deterioration diagnosis with respect to the battery at a first operation cycle on the basis of the physical quantity data, and transmit the physical quantity data and a diagnostic result of the deterioration diagnosis with respect to the battery to a server device configured to perform at least a processing other than the deterioration diagnosis with respect to the battery at an operation cycle which is longer than the first operation cycle.

(9) A recording medium according to an aspect of the present invention, on which a program is stored, is provided, and the program is configured to cause a computer of a server device that communicates with a first in-vehicle device to: receive at least either one of physical quantity data or a diagnostic result of deterioration diagnosis with respect to a battery from the first in-vehicle device, and perform at least a processing other than a deterioration diagnosis with respect to the battery at an operation cycle which is longer than a first operation cycle in which the deterioration diagnosis with respect to the battery is performed in a computer of the first in-vehicle device on the basis of the diagnostic result of the deterioration diagnosis with respect to the battery and/or the physical quantity data.

According to the aspects of the above-mentioned (1) to (9), it is possible to increase a real time property of determination of a deterioration state of a battery.

DETAILED DESCRIPTION OF THE INVENTION

Hereinafter, an embodiment of a battery state determination system, a battery state determination method, and a program of the present invention will be described with reference to the accompanying drawings.

[Entire Configuration]

Figure 1:
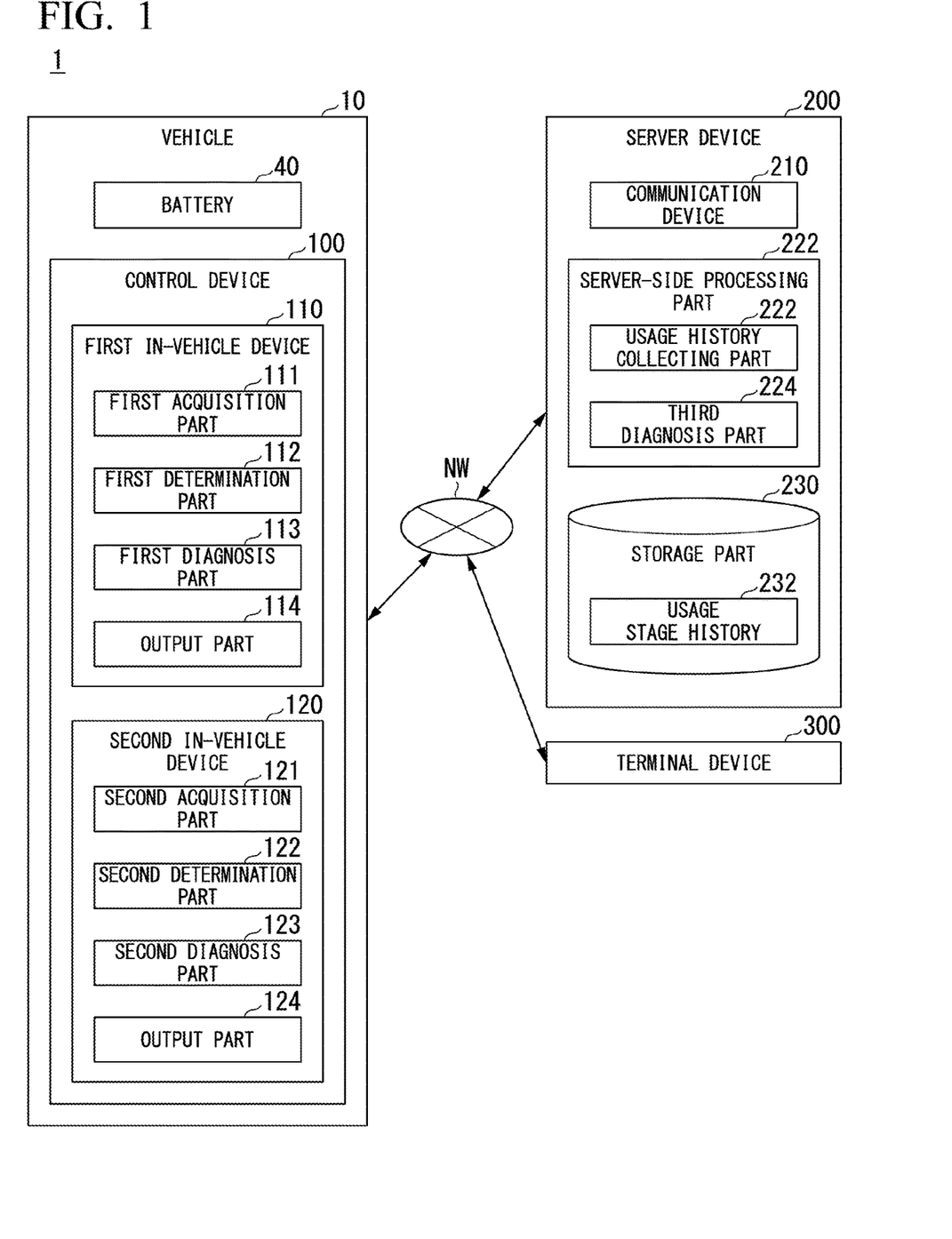
FIG. 1 is a configuration view of a battery state determination system.

FIG. 1 is a configuration view of a battery state determination system 1. The battery state determination system 1 includes, for example, a vehicle 10, a control device 100, a server device 200, and a terminal device 300. All of the vehicle 10, the server device 200 and the terminal device 300 are connected to a network NW to be able to communicate with other instruments. The network NW includes, for example, a cellular network, a Wi-Fi network, Bluetooth (Registered trademark), the Internet, a wide area network (WAN), a local area network (LAN), a public line, a provider device, a dedicated line, a radio base station, or the like. In addition, communication between the vehicle 10 and the control device 100 is performed through a communication bus such as a controller area network (CAN) bus or the like, a serial communication line, a wireless communication line, or the like.

The vehicle 10 is a vehicle which is equipped with a battery 40 that is a secondary battery such as a lithium ion battery or the like, and is, for example, a plug-in type electrically driven vehicle (an electric vehicle (EV)), a hybrid car (a hybrid vehicle (HV)), or the like.

Figure 2:
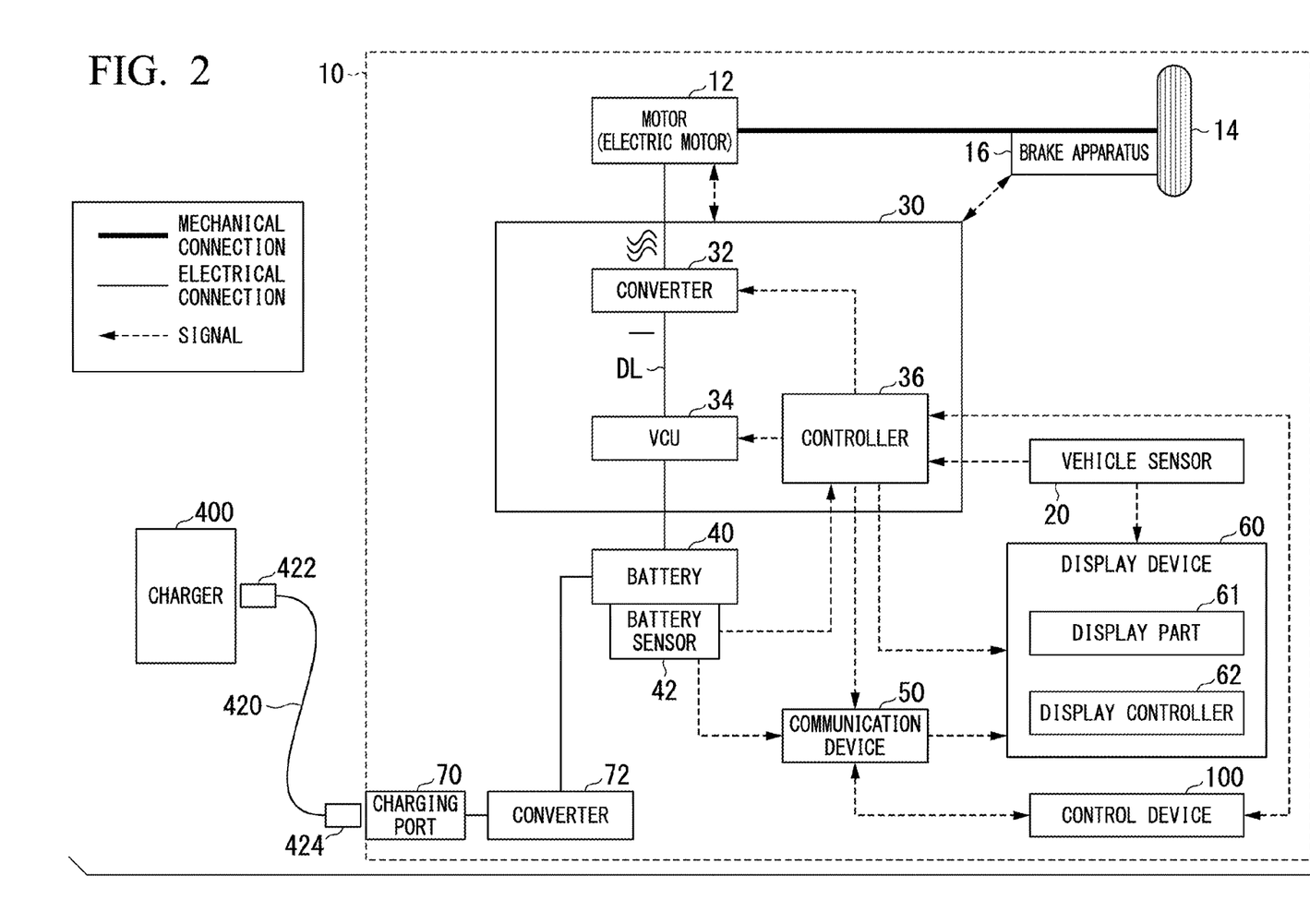
FIG. 2 is a view showing an example of a configuration of a vehicle.

FIG. 2 is a view showing an example of a configuration of the vehicle 10. The vehicle 10 includes, for example, a motor 12, a driving wheel 14, a brake device 16, a vehicle sensor 20, a power control unit (PCU) 30, a battery 40, a battery sensor 42 such as a voltage sensor, a current sensor, a temperature sensor, or the like, a communication device 50, a display device 60, a charging port 70, a converter 72, and the control device 100.

The motor 12 is, for example, a 3-phase AC motor. A rotor of the motor 12 is connected to the driving wheel 14. The motor 12 outputs a dynamic force to the driving wheel 14 using the supplied electric power. In addition, the motor 12 generates power using kinetic energy of the vehicle upon deceleration of the vehicle.

The brake device 16 includes, for example, a brake caliper, a cylinder configured to transmit a hydraulic pressure to the brake caliper, and an electric motor configured to generate a hydraulic pressure in the cylinder. The brake device 16 may include a mechanism configured to transmit a hydraulic pressure generated by an operation of a brake pedal to the cylinder via a master cylinder as a backup. Further, the brake device 16 is not limited to the above-mentioned configuration and may be an electronically controlled hydraulic brake device configured to transmit the hydraulic pressure of the master cylinder to the cylinder.

The vehicle sensor 20 includes an accelerator position sensor, a vehicle speed sensor, and a brake pedaling sensor. The accelerator position sensor is attached to an accelerator pedal, detects an operation amount of the accelerator pedal, and outputs the detected operation amount to a controller 36 as an accelerator position. The vehicle speed sensor includes, for example, wheel speed sensors attached to wheels, and a speed calculator, derives a speed (a vehicle speed) of the vehicle by combining the wheel speeds detected by the wheel speed sensors, and outputs the derived speed to the controller 36. The brake pedaling sensor is attached to the brake pedal, detects an operation amount of the brake pedal, and outputs the detected operation amount to the controller 36 as a brake pedaling amount.

The PCU 30 includes, for example, a converter 32, a voltage control unit (VCU) 34, and the controller 36. Further, the fact that these components are grouped together as the PCU 30 is just an example, and these components may be arranged in a distributed manner.

The converter 32 is, for example, an AC-DC converter. A DC-side terminal of the converter 32 is connected to a DC link DL. The battery 40 is connected to the DC link DL via the VCU 34. The converter 32 converts alternating current generated by the motor 12 into direct current, and outputs the converted direct current to the DC link DL. The VCU 34 is, for example, a DC-DC converter. The VCU 34 boosts the electric power supplied from the battery 40 and outputs the boosted electric power to the DC link DL.

The controller 36 includes, for example, a motor controller, a brake controller, and a battery/VCU controller. The motor controller, the brake controller, and the battery/VCU controller may be replaced with separate control devices, for example, control devices referred to as a motor ECU, a brake ECU, a battery ECU, and a battery VCU.

The controller 36 controls the motor 12 on the basis of the output of the vehicle sensor 20 in the motor controller. The controller 36 controls the brake device 16 on the basis of the output of the vehicle sensor 20 in the brake controller. The controller 36 derives a state of charge (SOC; hereinafter, also referred to as "a battery charging rate") of the battery 40 on the basis of the output of the battery sensor 42 attached to the battery 40 in the battery/VCU controller, and outputs the derived SOC to the VCU 34 and the display device 60. The controller 36 outputs the vehicle speed information output as the vehicle speed from the vehicle sensor 20 to the display device 60. The VCU 34 increases a voltage of the DC link DL according to the instruction from the battery/VCU controller.

The battery 40 is a secondary battery such as a lithium ion battery or the like. The electric power introduced from a charger 400 outside the vehicle 10 is stored in the battery 40, and discharge for traveling of the vehicle 10 is performed. The battery sensor 42 includes, for example, a current sensor, a voltage sensor, and a temperature sensor. The battery sensor 42 detects, for example, a current value, a voltage value, and a temperature of the battery 40. The battery sensor 42 outputs the detected current value, voltage value, temperature, or the like, to the controller 36.

The controller 36 estimates a deterioration degree of the battery 40, and further performs learning of the deterioration state of the battery 40. For example, the controller 36 calculates the current full charge capacity (hereinafter, referred to as "the current maximum capacity") of the battery 40. The controller 36 calculates a maximum capacity ratio (a deterioration state) with respect to the initial maximum capacity of the current maximum capacity on the basis of the current maximum capacity and the initial maximum capacity. The initial maximum capacity is a full charge capacity of the battery 40 at the time at shipment.

In addition, the controller 36 performs statistical processing such as clustering processing or the like with respect to a calculation result such as a full charge capacity, a ΔSOC, a charge/discharge electric power, a maximum capacity ratio, or the like. Accordingly, the controller 36 can learn the deterioration state of the battery 40. Further, the controller 36 may derive the deterioration degree of the battery 40 based on a value obtained by dividing an integrated value (ΔI [Ah]) of a charging current of the battery 40 between a first point of time and a second point of time different from the first point of time and after a predetermined time has elapsed by a difference (ΔSOC [%]) between the first charging rate of the battery 40 and the second charging rate of the battery 40.

The controller 36 outputs the calculation result to the display device 60. Further, the controller 36 may calculate a frequency of use of the battery 40, and output the calculated frequency to the display device. The frequency of use may be, for example, an operation degree (a ride frequency) of the vehicle 10, or may indicate a charge frequency or a discharge frequency of the battery 40.

The communication device 50 includes a wireless module configured to connect to a cellular network or a Wi-Fi network.

The display device 60 includes, for example, a display part (display) 61 and a display controller 62. The display controller 62 controls output of an image displayed on the display part 61 according to the output instruction from the other device.

The charging port 70 is provided on the outer side of the vehicle body of the vehicle 10. The charging port 70 is connected to the charger 400 via a charging cable 420. The charging cable 420 includes a first plug 422 and a second plug 424. The first plug 422 is connected to the charger 400, and the second plug 424 is connected to the charging port 70. Electricity supplied from the charger 400 is supplied to the charging port 70 via the charging cable 420.

In addition, the charging cable 420 includes a signal cable attached to an electric power cable. The signal cable mediates communication between the vehicle 10 and the charger 400. Accordingly, an electric power connector configured to connect to the electric power cable and a signal connector configured to connect to the signal cable are provided on the first plug 422 and the second plug 424, respectively.

The converter 72 is provided between the charging port 70 and the battery 40. The converter 72 converts the current introduced from the charger 400 via the charging port 70, for example, alternating current into the current supplied to the battery 40, for example, direct current. The converter 72 outputs the converted direct current to the battery 40.

Returning to FIG. 1, the control device 100 includes, for example, a first in-vehicle device 110 and a second in-vehicle device 120. Some of or all of functions provided in the control device 100 may be realized by hardware including a circuit part (circuitry) such as a large scale integration (LSI), an application specific integrated circuit (ASIC), a field-programmable gate array (FPGA), a graphics processing unit (GPU), or the like, or may be realized by cooperation of software and hardware. A program may be previously stored in a storage device including a non-transient recording medium such as a hard disk drive (HDD), a flash memory, or the like, or may be stored in a detachable non-transient recording medium such as a DVD, a CD-ROM, or the like, and installed by mounting the recording medium on a drive device.

The first in-vehicle device 110 is, for example, a battery management device in which a battery electronic control unit (ECU) is mounted (or, that is able to communicate with the battery ECU and output a command to the battery ECU). The second in-vehicle device 120 is a device such as a navigation device in which a navigation ECU is mounted, a gauge display management device in which a meter ECU is mounted, or the like. Which of the in-vehicle devices functions as the second in-vehicle device 120 may be preset by the manufacturer of the vehicle 10 or may be selected by a user of the vehicle 10.

The first in-vehicle device 110 includes, for example, a first acquisition part 111, a first determination part 112, a first diagnostic part 113, and an output part 114.

The first acquisition part 111 acquires a current value, a voltage value, or the like, detected by the battery sensor 42.

In addition, the first acquisition part 111 may acquire a calculation result such as a full charge capacity, ΔSOC, a charge/discharge electric power, a maximum capacity ratio, or the like, using the controller 36, or a statistical processing result such as clustering processing or the like. In addition, the first acquisition part 111 may further acquire information related to a usage history of a device mounted on the vehicle 10 (for example, the second in-vehicle device 120 or a peripheral device of the battery 40 that is the in-vehicle device other than the second in-vehicle device 120).

The first determination part 112 determines whether an operation processing load on the first in-vehicle device 110 is equal to or greater than a predetermined load degree. The first determination part 112 controls the first acquisition part 111 and the first diagnostic part 113 such that they perform operations when it is determined that the operation processing load on the first in-vehicle device 110 is less than the predetermined load degree.

The first determination part 112 performs control such that the diagnostic operation processing by the first diagnostic part 113 and the acquisition processing by the first acquisition part 111 are not performed when it is determined that the operation processing load on the first in-vehicle device 110 is equal to or greater than the predetermined load degree.

The first determination part 112 causes the output part 114 to output a processing command to the second in-vehicle device 120, which will be described below, to cause the second in-vehicle device 120 to perform the deterioration diagnosis processing for the battery 40 as an alternative, when control is performed such that the acquisition processing by the first acquisition part 111 and the diagnostic operation processing by the first diagnostic part 113 are not performed. Alternative processing in the second in-vehicle device 120 will be described below.

The first diagnostic part 113 performs deterioration diagnosis with respect to the battery 40 at a predetermined first operation cycle (about 10 [milliseconds]) on the basis of the current value, the voltage value, or the like, acquired by the first acquisition part 111. The first diagnostic part 113 may perform the deterioration diagnosis with respect to the battery 40 by itself by directly using the calculation result obtained by the controller 36 such as a full charge capacity, ΔSOC, charge/discharge electric power, a maximum capacity ratio, or the like, acquired through the first acquisition part 111, the statistical processing result such as clustering processing or the like, or by using the current value, the voltage value, or the like, acquired by the first acquisition part 111. In addition, the first diagnostic part 113 may perform diagnosis on the deterioration degree of the battery 40 due to the device usage by using information related to the usage history of the device mounted on the vehicle 10 which is acquired by the first acquisition part 111. The usage history of the device includes, for example, information such as the number of times when a contactor of the battery 40 was turned ON, the number of times of discharge, the number of times of charging, or the like.

The output part 114 outputs the deterioration diagnostic result obtained by the first diagnostic part 113 to the server device 200 via the communication device 50 of the vehicle 10. The combination of the functions of the output part 114 and the communication device 50 is an example of "a first transmission part."

In addition, the output part 114 outputs an alternative processing command to the second in-vehicle device 120 when it is determined by the first determination part 112 that processing by the first acquisition part 111 and the first diagnostic part 113 is not to be performed. At this time, at least a second acquisition part 121 and a second diagnostic part 123 of the second in-vehicle device 120 are operated.

In addition, the output part 114 transmits the information related to the usage history of the device mounted on the vehicle 10 to the server device 200 via the communication device 50 when the deterioration diagnostic result is transmitted to the server device 200.

The second in-vehicle device 120 includes, for example, the second acquisition part 121, a second determination part 122, the second diagnostic part 123, and an output part 124. The second acquisition part 121, the second diagnostic part 123 and the output part 124 are not operated at the time of normality (when the processing load of the first in-vehicle device 110 is less than the predetermined load degree) and are operated only at a time of abnormality (when the processing load of the first in-vehicle device 110 is equal to or greater than the predetermined load degree).

The second acquisition part 121 acquires the alternative processing command output from the output part 114 of the first in-vehicle device. Like the first acquisition part 111, the second acquisition part 121 acquires the current value, the voltage value, or the like, detected by the battery sensor 42 when the alternative processing command is acquired. In addition, the second acquisition part 121 may acquire the calculation result such as the full charge capacity, ΔSOC, charge/discharge electric power, maximum capacity ratio, or the like, by the controller 36, or the statistical processing result such as the clustering processing or the like.

Like the first determination part 112, the second determination part 122 determines whether the operation processing load on the first in-vehicle device 110 is equal to or greater than the predetermined load degree. The second determination part 122 is controlled not to perform the deterioration diagnosis with respect to the battery 40 in the first in-vehicle device 110 when it is determined that the operation processing load on the first in-vehicle device 110 is equal to or greater than the predetermined load degree. The second determination part 122 is controlled to perform the deterioration diagnosis with respect to the battery 40 in the first in-vehicle device 110 when it is determined that the operation processing load on the first in-vehicle device 110 is less than the predetermined load degree.

The second diagnostic part 123 performs the deterioration diagnosis processing of the first diagnostic part 113 as an alternative of the first diagnostic part 113. The second diagnostic part 123 may also perform diagnosis on the deterioration degree of the battery 40 according to the use of the device, when it performs the processing of the first diagnostic part 113 as an alternative of the first diagnostic part 113.

The output part 124 outputs the deterioration diagnostic result by the second diagnostic part 123 to the server device 200 via the communication device 50 of the vehicle 10. The combinations of the functions of the output part 124 and the communication device 50 is an example of "a second transmission part."

In addition, when it is determined by the second determination part 122 that the processing by the second diagnostic part 123 is not performed, the output part 124 outputs a processing command to the next deterioration diagnosis subject (the first in-vehicle device 110 or the server device 200).

Further, the first determination part 112 and the second determination part 122 are present to share roles with each other, and it is sufficient that at least one of them is functioning. For example, when the deterioration diagnosis processing in the first in-vehicle device 110 is performed, in order to reduce the operation load in the first in-vehicle device 110 or equalize the processing load between the first in-vehicle device 110 and the second in-vehicle device 120, in the case in which the processing of the first determination part 112 is stopped, the second determination part 122 may perform the determination processing of the load state of the first in-vehicle device 110 performed in the first determination part 112 as an alternative of the first determination part 112. In addition, for example, when the deterioration diagnosis processing in the first in-vehicle device 110 is performed and the determination processing of the first determination part 112 is performed, the second determination part 122 may be stopped. Each of the first determination part 112 and the second determination part 122 is an example of "the determination part."

Further, at least one of the first determination part 112 and the second determination part 122 may determine the load state of the second in-vehicle device 120. For example, the second determination part 122 achieves reduction in processing load by lengthening the operation cycle of the deterioration diagnosis processing or moves the subject of the deterioration diagnosis processing of the battery 40 to the server device 200 when it is determined that both of the first in-vehicle device 110 and the second in-vehicle device 120 have equal to or greater than the predetermined load degree. When the processing subject of the deterioration diagnosis with respect to the battery 40 is moved to the server device 200, either the output part 114 or the output part 124 transmits the current value and the voltage value detected by the battery sensor 42 to the server device 200 via the communication device 50.

The server device 200 includes, for example, a communication device 210, a server-side processing part 220, and a storage part 230. Some or all of the functions provided by the communication device 210 and the server-side processing part 220 may be realized by hardware including a circuit part (circuitry) such as an LSI, an ASIC, an FPGA, a GPU, or the like, or may be realized by cooperation of software and hardware. The program may be previously stored in the storage part 230 including a non-transient recording medium such as an HDD, a flash memory, or the like, may be stored on a detachable non-transient recording medium such as a DVD, a CD-ROM, or the like, or may be installed by mounting the recording medium on a drive device.

The communication device 210 receives the current value and the voltage value detected by the battery sensor 42. The communication device 210 further receives the deterioration diagnostic result by the control device 100 via the communication device 50 of the vehicle 10. The communication device 210 is an example of "the reception part." In addition, the communication device 210 outputs the processing result by the server-side processing part 220 to the vehicle 10 or the terminal device 300.

The server-side processing part 220 performs at least a processing, which is other than the deterioration diagnosis with respect to the battery 40, at the operation cycle which is longer than the above-mentioned first operation cycle (hereinafter, referred to as a second operation cycle) on the basis of the diagnostic result of the deterioration diagnosis with respect to the battery, and/or the current value, the voltage value. Processing other than the deterioration diagnosis with respect to the battery 40 is, for example, a processing of collecting the usage history of the battery 40.

In addition, the server-side processing part 220 may perform the deterioration diagnosis processing of the battery 40 by itself when the deterioration diagnosis processing of the battery 40 is not performed by the control device 100.

The server-side processing part 220 includes, for example, a usage history collecting part 222 and a third diagnostic part 224.

The usage history collecting part 222 collects information related to usage history of the device mounted in the vehicle 10 and stores the collected information in a usage state history 232 of the storage part 230.

The third diagnostic part 224 substitutes for performing the deterioration diagnosis processing instead of the first diagnostic part 113 and the second diagnostic part 123 of the control device 100. The third diagnostic part 224 may perform, for example, the deterioration diagnosis processing at the second operation cycle, or may perform the deterioration diagnosis processing at an operation cycle (for example, about 2 to 3 [sec]) different from the second operation cycle.

Some or all of the processing results by the server-side processing part 220 may be returned to the vehicle 10, or may be transmitted to the terminal device 300. The storage part 230 is realized by, for example, an HDD, a flash memory, an electrically erasable programmable read only memory (EEPROM), a read only memory (ROM), a random access memory (RAM), or the like. The storage part 230 stores, for example, a program read and executed by a processor.

The terminal device 300 is a terminal device such as a mobile phone, a smartphone, a tablet terminal, a personal computer, or the like, used by a user of the vehicle 10. The terminal device 300 notifies the user of the vehicle 10 of the deterioration diagnostic result of the battery 40. For example, a dedicated application that receives a setting change (a setting change of determination accuracy) of the first operation cycle in which the deterioration diagnosis with respect to the battery 40 is performed or a setting change to select and switch a device functioning as the second in-vehicle device 120 and curb deterioration of the battery 40 regarding the control device 100 is installed in the terminal device 300, and the user performs various types of settings of the control device 100 according to the deterioration state of the battery 40.

[Communication Bus Configuration]

The CAN bus is a bus configured to perform communication using CAN data. The CAN data is constituted using, for example, a predetermined data format referred to as a frame. The frame includes an error frame or the like transmitted when a data frame that transmits data or various types of communication errors are generated. In addition, the CAN data includes, for example, a CAN-ID as identification information that identifies an instrument connected to the CAN bus. The CAN-ID is previously set for the instrument connected to the CAN bus. Each instrument connected to the CAN bus recognizes the CAN-ID thereof or a CAN-ID of another instrument. Each instrument generates CAN data including a CAN-ID of a partner (a destination) and outputs the generated CAN data to the CAN bus when data are transmitted, acquires the CAN data including the CAN-ID thereof among the plurality of received CAN data when receiving the data, and discards another CAN data.

In addition, each instrument transmits the CAN data at a predetermined timing. The predetermined timing may be, for example, a predetermined interval, or may be a timing when a transmission requirement is received from each instrument or a timing when some control results are obtained by the control by the ECU. In addition, the predetermined timing may be the same as the above-mentioned predetermined first operation cycle.

Figure 3:
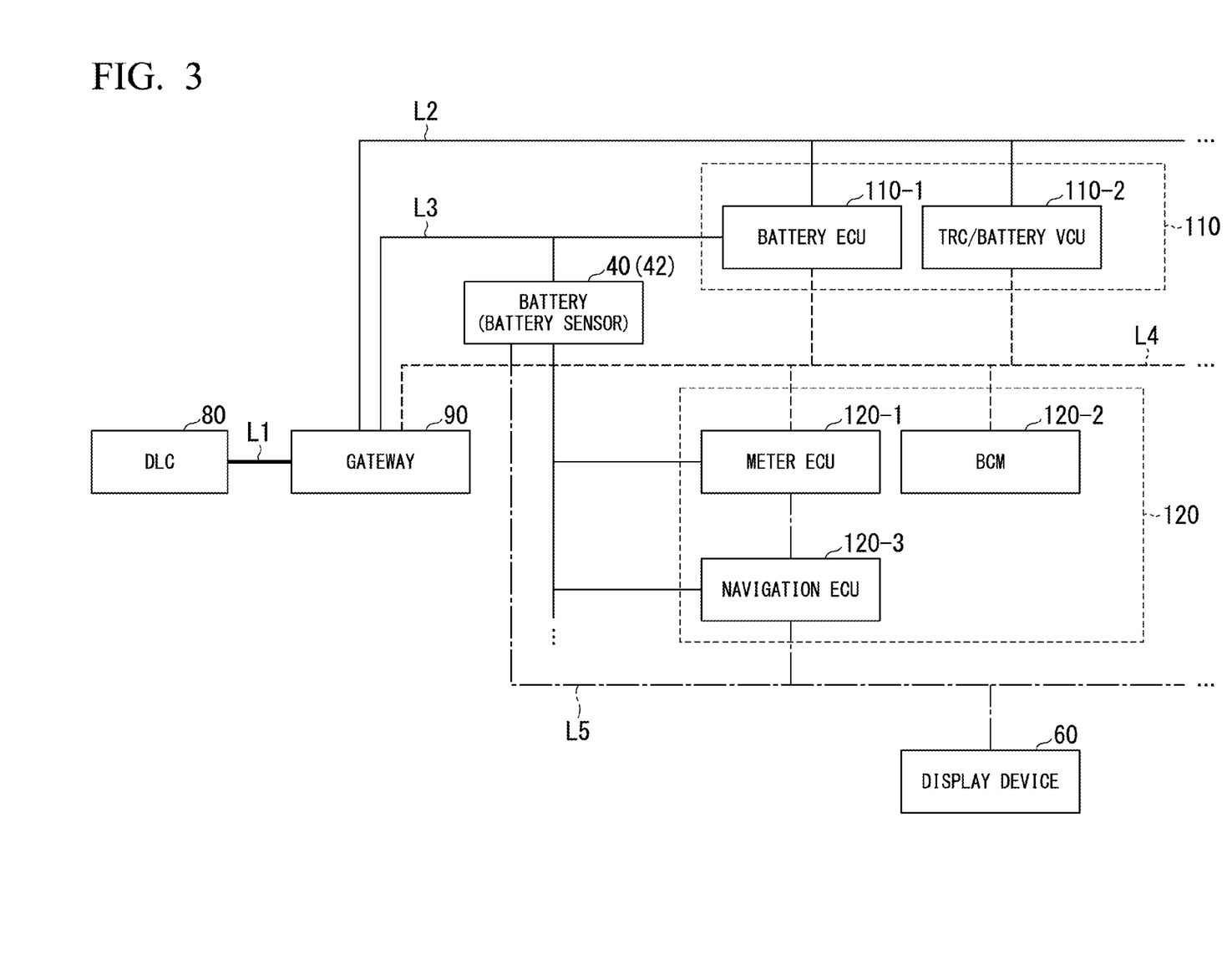
FIG. 3 is a view schematically showing a communication bus configuration of a control device.

FIG. 3 is a view schematically showing a communication bus configuration of the control device 100. For example, a data link connector (DLC) 80 and a gateway 90 are connected to the communication bus to which the first in-vehicle device 110 and the second in-vehicle device 120 of the control device 100 are connected. Further, another in-vehicle device (not shown) of the display device 60 or the like may be connected to the communication bus to which the first in-vehicle device 110 and the second in-vehicle device 120 of the control device 100 are connected. Further, FIG. 3 shows an example in which components of the controller 36 are arranged in a distributed manner.

The DLC 80 is connected to the gateway 90 that is a relay device by, for example, a communication bus L1.

The gateway 90 is a relay device connected to components of the first in-vehicle device 110 and the second in-vehicle device 120 by communication buses L2 to L5, or a device other than the battery 40 or the first in-vehicle device 110 and the second in-vehicle device 120, or the like.

A battery ECU 110-1 controls charge/discharge of the battery 40 directly or via the controller 36.

A the TRC/battery VCU 110-2 causes the VCU 34 to boost the electric power supplied from the battery 40 and output the boosted electric power to the DC link DL in order to prevent idling of a tire upon starting and acceleration.

A meter ECU 120-1 controls a meter display management device of the vehicle 10 directly or via the controller 36.

A body control module (BCM) 120-2 generally manages and controls the in-vehicle device of the vehicle 10 such as a lighting device, a wiper device, an air-conditioning system, a seat adjusting device, or the like.

A navigation ECU 120-3 controls a navigation device of the vehicle 10 directly or via the controller 36.

For example, the gateway 90, the battery ECU 110-1 and a traction control (TRC)/battery VCU 110-2 are connected to the communication bus L2. In addition, for example, the battery 40, the battery sensor 42, the gateway 90, the battery ECU 110-1, the meter ECU 120-1, and the navigation ECU 120-3 are connected to the communication bus L3. In addition, for example, the battery 40, the battery sensor 42, the gateway 90, the battery ECU 110-1, the TRC/battery VCU 110-2, the meter ECU 120-1, a BCM 120-2, and the navigation ECU 120-3 are connected to the communication bus L4. In addition, for example, the battery 40, the battery sensor 42, the navigation ECU 120-3, and the display device 60 are connected to the communication bus L5.

For example, while the first in-vehicle device 110 is performing the deterioration diagnosis with respect to the battery 40 via the communication bus L3, the first determination part 112 of the first in-vehicle device 110 may determine that the processing load is equal to or greater than the predetermined load. In this case, the gateway 90 switches the communication bus to the communication bus L4 or the communication bus L5, and moves the subjects of the deterioration diagnosis with respect to the battery 40 to the second in-vehicle device 120.

[Processing Flow]

Figure 4:
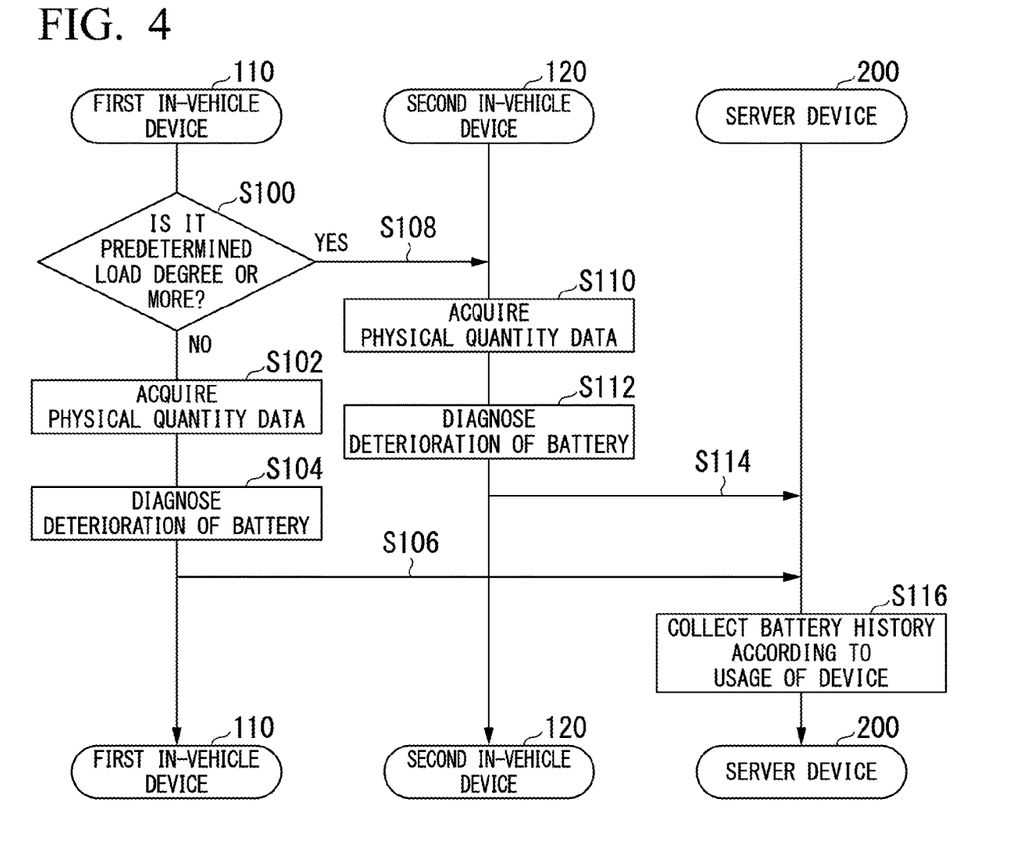
FIG. 4 is a timing chart showing an example of a processing flow of a battery state determination system.

FIG. 4 is a timing chart showing an example of a processing flow of the battery state determination system 1.

First, the first determination part 112 determines whether the operation load of the first in-vehicle device 110 is equal to or greater than the predetermined load degree (step S100). When it is determined by the first determination part 112 that the operation load is not equal to or greater than the predetermined load degree, the first acquisition part 111 acquires the current value, the voltage value, or the like, that is physical quantity data of the battery 40 and detected by the battery sensor 42 (step S102). Next, the first diagnostic part 113 performs the deterioration diagnosis with respect to the battery 40 (step S104). Next, the output part 114 outputs the information related to the diagnostic result obtained by the first diagnostic part 113 or the physical quantity data of the battery 40 and the usage history of the device to the server device 200 (step S106).

In step S100, when it is determined by the first determination part 112 that it is equal to or greater than the predetermined load degree, the output part 114 outputs a command for transferring the subject of the diagnosis processing to the second in-vehicle device 120 (step S108). Next, the second acquisition part 121 acquires the physical quantity data of the battery 40 (step S110). Next, the second diagnostic part 123 performs the deterioration diagnosis with respect to the battery 40 (step S112). Next, the output part 124 outputs the information, which is related to the diagnostic result by the second diagnostic part 123 or the physical quantity data of the battery 40 and the usage history of the device, to the server device 200 (step S114).

After the processing of step S106 or step S114, the usage history collecting part 222 performs collecting processing of the usage history of the battery 40 according to the usage of the device of the vehicle 10 (step S116). Hereinafter, processing of the timing chart is terminated.

Further, after it is determined that the processing load of the first in-vehicle device is equal to or greater than the predetermined load degree and the subject of the deterioration diagnosis is transferred to the second in-vehicle device 120, in the timing chart shown in FIG. 4, the processing of the first determination part 112 in step S100 is performed in the second determination part 122 of the second in-vehicle device 120. In addition, the second determination part 122 may perform processing of determining whether it is preferable to return the processing to the first in-vehicle device 110 at a predetermined cycle after it is determined that the processing load of the first in-vehicle device is equal to or greater than the predetermined load degree and the subject of the deterioration diagnosis is transferred to the second in-vehicle device 120 without performing the above-mentioned processing.

Figure 5:
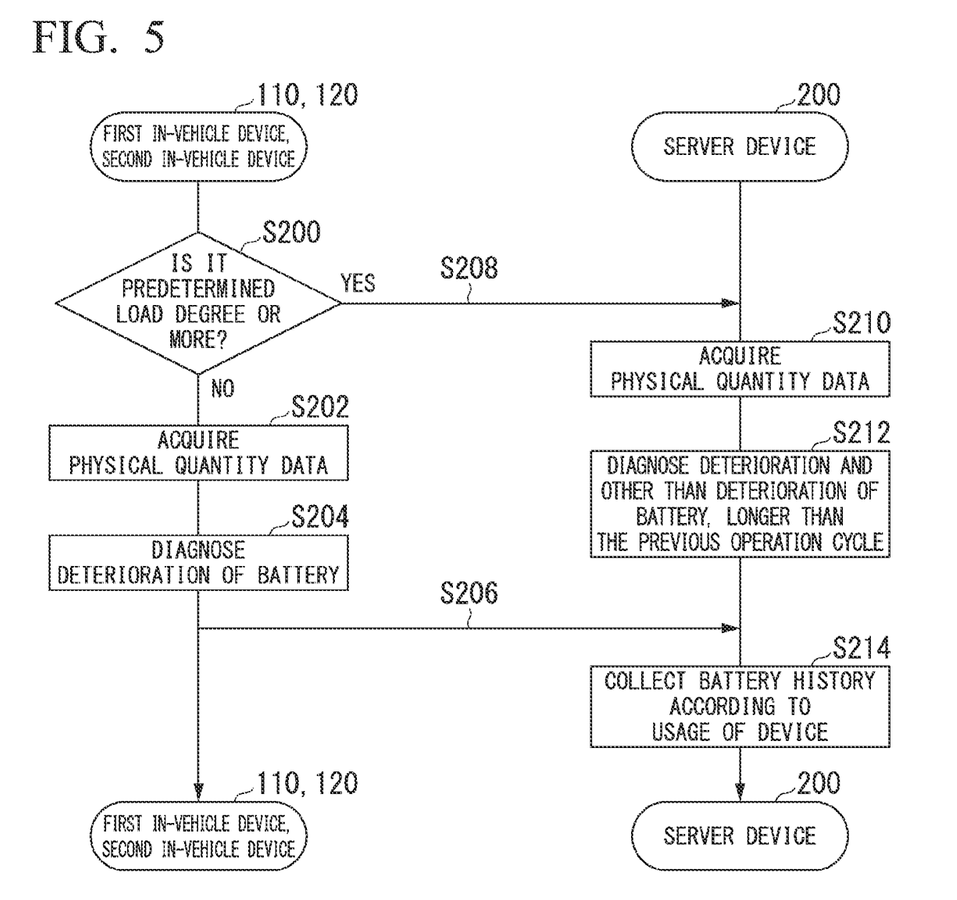
FIG. 5 is a timing chart showing another example of a processing flow of the battery state determination system.

FIG. 5 is a timing chart showing another example of a processing flow of the battery state determination system 1. In FIG. 5, a processing flow when the deterioration diagnosis processing of the battery 40 cannot be performed in the first in-vehicle device 110 and the second in-vehicle device 120 will be described. Further, the processing from step S200 to step S206 is the same as the processing from step S100 to S106 of the timing chart shown in FIG. 4 (or realized by performing the same processing as in the second in-vehicle device 120). Accordingly, hereinafter, a processing flow after step S208 will be mainly described.

In step S200, when it is determined by the first determination part 112 (or the second determination part 122) that the operation load of the first in-vehicle device 110 is equal to or greater than the predetermined load degree and the deterioration diagnosis processing of the battery 40 in the second in-vehicle device 120 cannot be performed, the output part 114 (or the output part 124) outputs a command of transferring the subject of the diagnosis processing to the server device 200 and information related to the physical quantity data of the battery 40 and the usage history of the device (step S208).

Next, the server-side processing part 220 acquires the physical quantity data of the battery 40 (step S210). Next, the third diagnostic part 224 performs the deterioration diagnosis with respect to the battery 40 (step S212).

After the processing of step S206 or step S212, the usage history collecting part 222 performs collecting processing of the usage history of the battery 40 according to the usage of the device of the vehicle 10 (step S214). Hereinabove, the processing of the above-mentioned timing chart is terminated.

The battery state determination system 1 of the above-mentioned embodiment can increase accuracy (a real time property) of the deterioration diagnosis with respect to the battery 40 by controlling the battery 40 and performing the deterioration diagnosis with respect to the battery 40 in the first in-vehicle device 110 that performs the deterioration diagnosis processing of the battery 40.

In addition, the battery state determination system 1 of the embodiment can maintain the accuracy (the real time property) of the deterioration diagnosis with respect to the battery 40 by transferring the subject of deterioration diagnosis processing to the second in-vehicle device 120 and continuing the deterioration diagnosis with respect to the battery 40 when the processing load of the first in-vehicle device 110 is equal to or greater than the predetermined load degree.

In addition, the battery state determination system 1 of the embodiment can continuously perform the deterioration diagnosis with respect to the battery 40 by moving the subject of the deterioration diagnosis processing to the server device 200 by continuing the deterioration diagnosis with respect to the battery 40 when the processing load of the first in-vehicle device 110 is equal to or greater than the predetermined load degree and the deterioration diagnosis processing cannot be performed even in the second in-vehicle device 120.

Further, the battery state determination system 1 may not include the second in-vehicle device 120. In this case, the processing of the flowchart of FIG. 4 is not performed, and the processing of the flowchart of FIG. 5 is performed by only the first in-vehicle device 110.

[Hardware Configuration]

Figure 6:
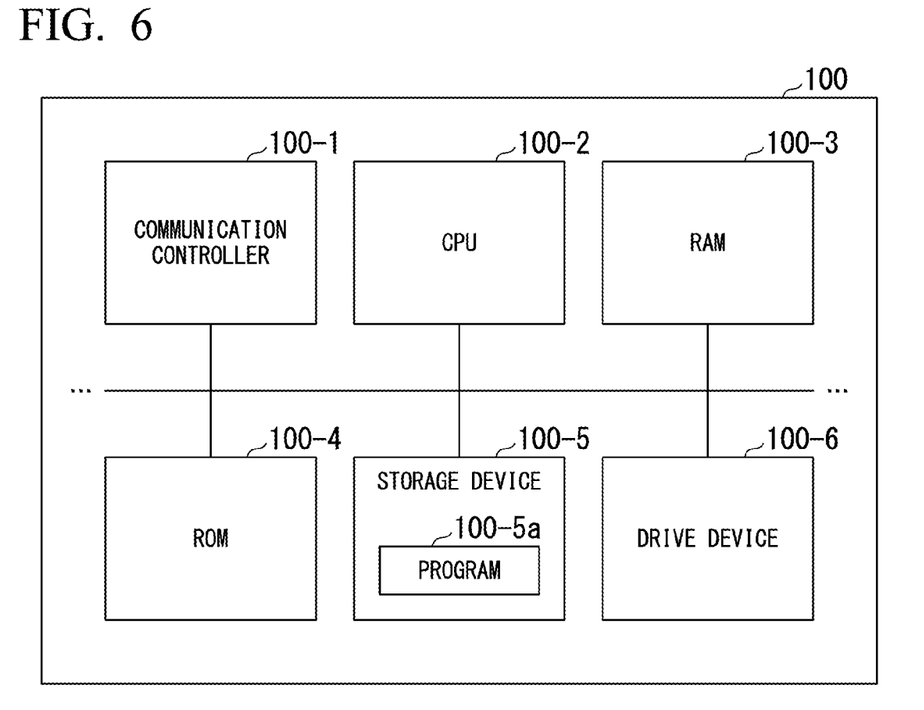
FIG. 6 is a view showing an example of a hardware configuration of a control device of an embodiment.

FIG. 6 is a view showing an example of a hardware configuration of the control device 100 of the embodiment. As shown, various types of control devices have a configuration in which a communication controller 100-1, a CPU 100-2, a RAM 100-3 used as a working memory, a ROM 100-4 on which a booting program or the like is stored, a storage device 100-5 such as a flash memory, an HDD, or the like, a drive device 100-6, and the like, are connected to each other by an internal bus or a dedicated communication line. The communication controller 100-1 performs communication with components other than the control device 100. A program 100-5a executed by the CPU 100-2 is stored in the storage device 100-5. The program is expanded to the RAM 100-3 by a direct memory access (DMA) controller (not shown) or the like, and executed by the CPU 100-2. Accordingly, a part of or the entire the control device 100 is realized.

The above-mentioned embodiment can be expressed as below.

A control device comprising:
a storage device in which a program is stored; and
a hardware processor,
wherein the hardware processor acquires physical quantity data showing physical quantity related to a state of a battery mounted on the vehicle and performs deterioration diagnosis with respect to the battery at a first operation cycle on the basis of the physical quantity data, and transmitting the physical quantity data and a diagnostic result of deterioration diagnosis with respect to the battery to a server device
by executing the program stored in the storage device.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A battery state determination system comprising:
a first in-vehicle device; and
a server device,
wherein the first in-vehicle device comprises:
a first acquisition part configured to acquire physical quantity data showing a physical quantity related to a state of a battery mounted on the vehicle;
a first diagnostic part configured to perform deterioration diagnosis with respect to the battery at a first operation cycle on the basis of the physical quantity data; and
a first transmission part configured to transmit the physical quantity data and the diagnostic results of deterioration diagnosis with respect to the battery obtained by the first diagnostic part to the server device, and
the server device comprises:
a reception part configured to receive at least either one of the physical quantity data or the diagnostic result of the deterioration diagnosis with respect to the battery from the first in-vehicle device; and
a server-side processing part configured to perform at least a processing other than the deterioration diagnosis with respect to the battery at an operation cycle which is longer than the first operation cycle on the basis of the diagnostic result of the deterioration diagnosis with respect to the battery and/or the physical quantity data.

2. The battery state determination system according to claim 1, further comprising a second in-vehicle device mounted on the vehicle in which the first in-vehicle device is mounted and different from the first in-vehicle device,
wherein the second in-vehicle device comprises:
a second acquisition part configured to acquire the physical quantity data;
a second diagnostic part configured to perform the deterioration diagnosis with respect to the battery as an alternative of the first diagnostic part; and
a second transmission part configured to transmit the physical quantity data and the diagnostic results obtained by the second diagnostic part to the server device,
the first in-vehicle device comprises a determination part configured to determine whether an operation processing load on the first in-vehicle device is equal to or greater than a predetermined load degree, and
at least the second diagnostic part and the second transmission part are operated when it is determined by the determination part that the operation processing load on the first in-vehicle device is equal to or greater than the predetermined load degree.

3. The battery state determination system according to claim 1, further comprising a second in-vehicle device mounted on the vehicle in which the first in-vehicle device is mounted and different from the first in-vehicle device, wherein the second in-vehicle device comprises:
a second acquisition part configured to acquire the physical quantity data;
a second diagnostic part configured to perform the deterioration diagnosis with respect to the battery as an alternative of the first diagnostic part;
a second transmission part configured to transmit the physical quantity data and the diagnostic results obtained by the second diagnostic part to the server device; and
a determination part configured to determine whether an operation processing load on the first in-vehicle device is equal to or greater than a predetermined load degree, and
at least the second diagnostic part and the second transmission part are operated when it is determined by the determination part that the operation processing load on the first in-vehicle device is equal to or greater than the predetermined load degree.

4. The battery state determination system according to claim 1, wherein the server-side processing part collects a usage history of the battery as the processing other than the deterioration diagnosis with respect to the battery.

5. The battery state determination system according to claim 2, wherein the first transmission part further transmits information related to the usage history of the device mounted on the vehicle, and
at least one of the first diagnostic part and the second diagnostic part performs diagnosis of a deterioration degree of the battery according to the usage of the device.

6. The battery state determination system according to claim 2, wherein the determination part further determines whether an operation processing load of the second in-vehicle device is equal to or greater than the predetermined load degree, and
the server device further comprises a third diagnostic part configured to perform the deterioration diagnosis by the first diagnostic part with respect to the battery instead of the first diagnostic part when it is determined by the determination part that both operation processing loads of the first in-vehicle device and the second in-vehicle device are equal to or greater than the predetermined load degree.

7. The battery state determination system according to claim 3, wherein the first transmission part further transmits information related to the usage history of the device mounted on the vehicle, and
at least one of the first diagnostic part and the second diagnostic part performs diagnosis of a deterioration degree of the battery according to the usage of the device.

8. The battery state determination system according to claim 3, wherein the determination part further determines whether an operation processing load of the second in-vehicle device is equal to or greater than the predetermined load degree, and
the server device further comprises a third diagnostic part configured to perform the deterioration diagnosis by the first diagnostic part with respect to the battery instead of the first diagnostic part when it is determined by the determination part that both operation processing loads of the first in-vehicle device and the second in-vehicle device are equal to or greater than the predetermined load degree.

9. The battery state determination system according to claim 5, wherein the determination part further determines whether an operation processing load of the second in-vehicle device is equal to or greater than the predetermined load degree, and
the server device further comprises a third diagnostic part configured to perform the deterioration diagnosis by the first diagnostic part with respect to the battery instead of the first diagnostic part when it is determined by the determination part that both operation processing loads of the first in-vehicle device and the second in-vehicle device are equal to or greater than the predetermined load degree.

10. The battery state determination system according to claim 7, wherein the determination part further determines whether an operation processing load of the second in-vehicle device is equal to or greater than the predetermined load degree, and
the server device further comprises a third diagnostic part configured to perform the deterioration diagnosis by the first diagnostic part with respect to the battery instead of the first diagnostic part when it is determined by the determination part that both operation processing loads of the first in-vehicle device and the second in-vehicle device are equal to or greater than the predetermined load degree.

11. A battery state determination method, which is performed by an in-vehicle device, comprising:
acquiring physical quantity data showing a physical quantity related to a state of a battery mounted on the vehicle;
performing deterioration diagnosis with respect to the battery at a first operation cycle on the basis of the physical quantity data; and
transmitting the physical quantity data and a diagnostic result of the deterioration diagnosis with respect to the battery to a server device,
wherein the server device receives at least either one of the physical quantity data or the diagnostic result of the deterioration diagnosis with respect to the battery from the in-vehicle device, and
performs at least a processing other than the deterioration diagnosis with respect to the battery at an operation cycle which is longer than the first operation cycle on the basis of the diagnostic result of the deterioration diagnosis with respect to the battery and/or the physical quantity data.

* * * * *